United States Patent
Yang et al.

(10) Patent No.: US 8,247,869 B2
(45) Date of Patent: Aug. 21, 2012

(54) LDMOS TRANSISTORS WITH A SPLIT GATE

(75) Inventors: Hongning Yang, Chandler, AZ (US);
Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 156 days.

(21) Appl. No.: 12/767,536

(22) Filed: Apr. 26, 2010

(65) Prior Publication Data

US 2011/0260247 A1    Oct. 27, 2011

(51) Int. Cl.
    *H01L 29/66*      (2006.01)
    *H01L 29/78*      (2006.01)
(52) U.S. Cl. .............. 257/336; 257/335; 257/E29.256
(58) Field of Classification Search .............. 257/335, 257/336, 340, E29.256
See application file for complete search history.

(56) References Cited

U.S. PATENT DOCUMENTS

| | | | |
|---|---|---|---|
| 5,777,362 A * | 7/1998 | Pearce | 257/335 |
| 6,825,531 B1 | 11/2004 | Mallikarjunaswamy | |
| 7,344,947 B2 * | 3/2008 | Ivanov et al. | 438/286 |
| 7,405,443 B1 * | 7/2008 | Zuniga et al. | 257/328 |
| 7,608,513 B2 | 10/2009 | Yang et al. | |
| 7,902,020 B2 * | 3/2011 | Park | 438/227 |
| 2005/0067655 A1 | 3/2005 | Shibib et al. | |
| 2006/0113601 A1 | 6/2006 | Shibib et al. | |
| 2009/0181503 A1 | 7/2009 | Bhalla et al. | |
| 2011/0241113 A1 * | 10/2011 | Zuniga | 257/343 |

OTHER PUBLICATIONS

Hong Xiao, Introduction to Semiconductor Manufacturing Technology, 2001, Prentice Hall, pp. 127-128.*
U.S. Appl. No. 12/560,588, filed Sep. 16, 2009.

* cited by examiner

*Primary Examiner* — Jerome Jackson, Jr.
*Assistant Examiner* — Paul Budd
(74) *Attorney, Agent, or Firm* — James L. Clingan, Jr.; David G. Dolezal

(57) ABSTRACT

A transistor including a source region, drain region, channel region, drift region, isolation region, a first gate structure over the channel region, and a second gate structure over the isolation region is provided. The drift region includes a first portion located under the isolation region and a second portion located laterally adjacent to the isolation region. The first gate structure is separated by a first separation space from the second gate structure. The first separation space is located over a portion of the second portion of the drift region and a portion of the isolation region.

16 Claims, 4 Drawing Sheets

LDMOS TRANSISTORS WITH A SPLIT GATE

BACKGROUND

1. Field

This disclosure relates generally to LDMOS transistors, and more specifically, to LDMOS transistors with a split gate.

2. Related Art

Laterally diffused metal oxide semiconductor (LDMOS) transistors are typically used in high power applications, such as DC-DC converters and RF/microwave power amplifiers. One of the key requirements for such LDMOS transistors is to have a drain to source breakdown voltage (BVDSS) greater than the operating voltage by at least a certain margin, such as a margin of 10 volts. As the operating voltage of the LDMOS transistors has gone up, so has the need for a higher BVDSS of the LDMOS transistors.

Accordingly, there is a need for LDMOS transistors with a higher BVDSS.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
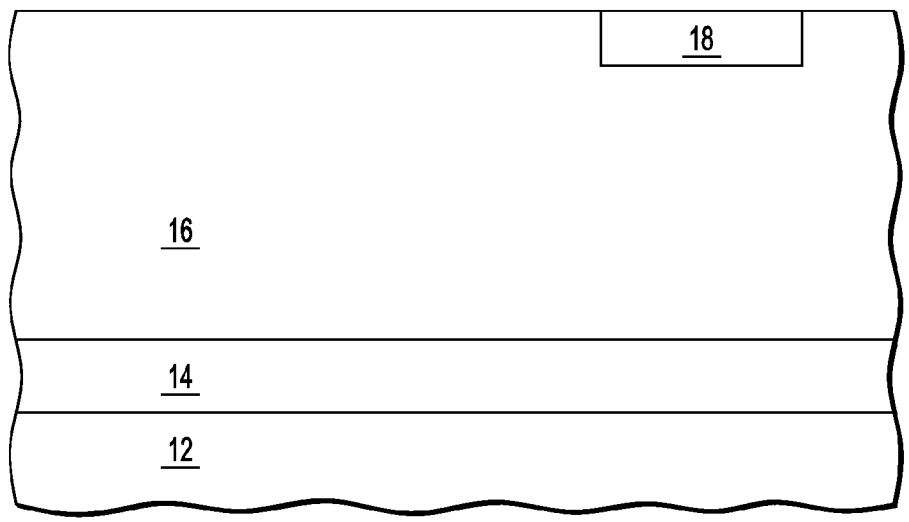
FIGS. 1-5 are cross-section views of an n-type LDMOS transistor during processing stages.

An increase in operating voltages of LDMOS transistors is resulting in higher instances of breakdown of these transistors. The drain to source voltage at which such breakdown occurs is referred to herein as the drain to source breakdown voltage (BVDSS). In LDMOS transistors, one of the root causes of the breakdown caused by a high drain to source voltage is the impact ionization at the corner of the gate and the shallow trench isolation or field oxide. Specifically, a high electric field near the corner of the gate and the shallow trench isolation or field oxide can increase the impact ionization at the corner. The impact ionization can increase dramatically with the increase in the drain to source voltage and can cause avalanche breakdown. One way to reduce the effect of the increased electric field near the corner is to increase the length of the drift region of the LDMOS transistor. This increase in the length of the drift region, however, increases the on resistance (Rdson) of the LDMOS transistor. Another way to reduce the effect of the high electric field near the corner is to reduce the dosage of implants into the drift region of the LDMOS transistor. This, however, also increases the on resistance (Rdson) of the LDMOS transistor. In one embodiment, the present invention provides a solution to the high electric field based breakdown of LDMOS transistors.

In one aspect, a transistor including: (1) a source region of a first conductivity type, the source region located in a substrate structure; (2) a drain region of the first conductivity type, the drain region located in the substrate structure; (3) a well region of a second conductivity type, the second conductivity type being an opposite conductivity type of the first conductivity type, the well region including a channel region of the transistor; and (4) an isolation region of a dielectric material located in substrate structure is provided. The transistor further includes a drift region of the first conductivity type, the drift region including a first portion located under the isolation region and a second portion located laterally adjacent to the isolation region, where at a plane at a first cross-section of the transistor, the plane generally parallel to a first major surface of the substrate structure, a second portion of the drift region is located between the isolation region and the well region. The transistor further includes a first gate structure located over the channel region and a second gate structure located over the isolation region, wherein at the first cross section of the transistor, a first gate structure is separated from the second gate structure by a first separation space, where at the first cross section, the first separation space is located over a portion of the second portion of the drift region and a portion of the isolation region.

In another aspect, a laterally diffused MOS (LDMOS) transistor including: (1) a source region located in a substrate structure; (2) a drain region located in the substrate structure; (3) a channel region located in the substrate structure; and (4) an isolation region located in the substrate structure is provided. The LDMOS transistor further includes a drift region located in the substrate structure, the drift region including a first portion under the isolation region and a second portion laterally adjacent to the isolation region. The LDMOS transistor further includes a first gate structure located over the channel region and a second gate structure located over the isolation region, wherein at a first cross-section, the first gate structure and a second gate structure are physically separated by a first separation space, where at the first cross-section, a portion of the first separation space is located over a location of the substrate where the second portion of the drift region abuts and is laterally adjacent to the isolation region.

In yet another aspect, a method of making a transistor is provided. The method includes: (1) forming an isolation region in a substrate structure; (2) forming a source region in the substrate structure; (3) forming a channel region in the substrate structure; and (4) forming drain region in the substrate structure. The method further includes forming a drift region in a substrate structure, where a first portion of the drift region is located under the isolation region and a second portion of the drain region is located laterally adjacent to the isolation region. The method further includes forming a first gate structure and a second gate structure of the transistor over the substrate structure, the first gate structure located over the channel region and the second gate structure located over the isolation region, at a first cross-section of the transistor, the first gate structure is separated from the second gate structure by a separation space, where the separation space is located over a portion of the second portion of the drift region and a portion of the isolation region.

The substrate described herein can be any semiconductor material or combinations of materials, such as gallium arsenide, silicon germanium, silicon-on-insulator (SOI), silicon, monocrystalline silicon, the like, and combinations of the above.

FIG. 1 shows a cross-section of a view of an n-type LDMOS transistor 10 during a processing stage. N-type LDMOS transistor 10 may be formed by forming an n-type barrier layer 14 over a p-type substrate 12. Next, as part of forming n-type LDMOS transistor 10, a p-type epitaxial layer 16 may be grown over n-type barrier layer 14. Next, an isolation region 18 may be formed in p-type epitaxial layer 16. Isolation region 18 may be formed by growing field oxide or by forming a shallow trench isolation region and filling the trench isolation region with TEOS oxide.

Figure 2:
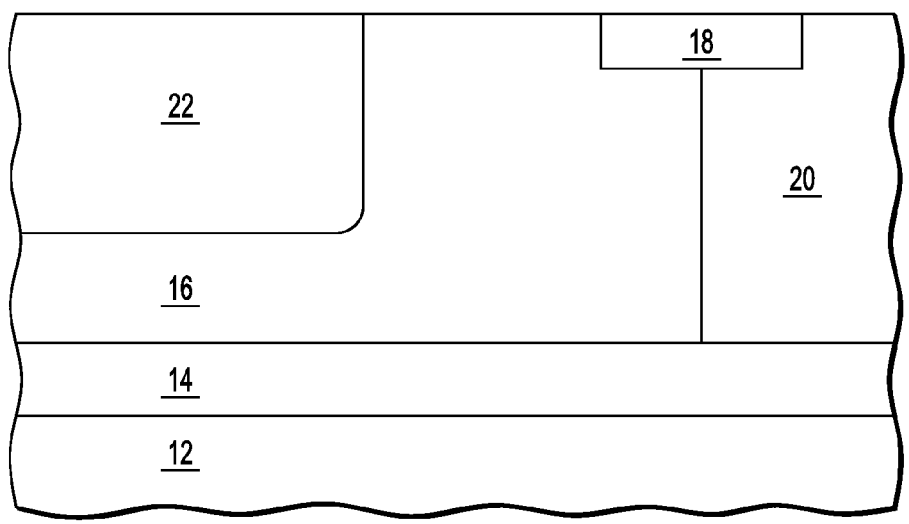

Referring now to FIG. 2, another cross-section view of an n-type LDMOS transistor 10 during a processing stage is shown. As shown, an n-well region 20 may be formed by implanting dopants of a higher concentration in a selective area of p-type epitaxial layer 16. In one embodiment, n-well region 20 may connect n-type barrier layer 14 with the surface of the drain region of n-type LDMOS transistor 10. As part of this step or in a next step, p-type body region 22 (also referred to a high voltage p-well region) may also be formed by implanting dopants in a selective area of p-type epitaxial layer 16.

Figure 3:
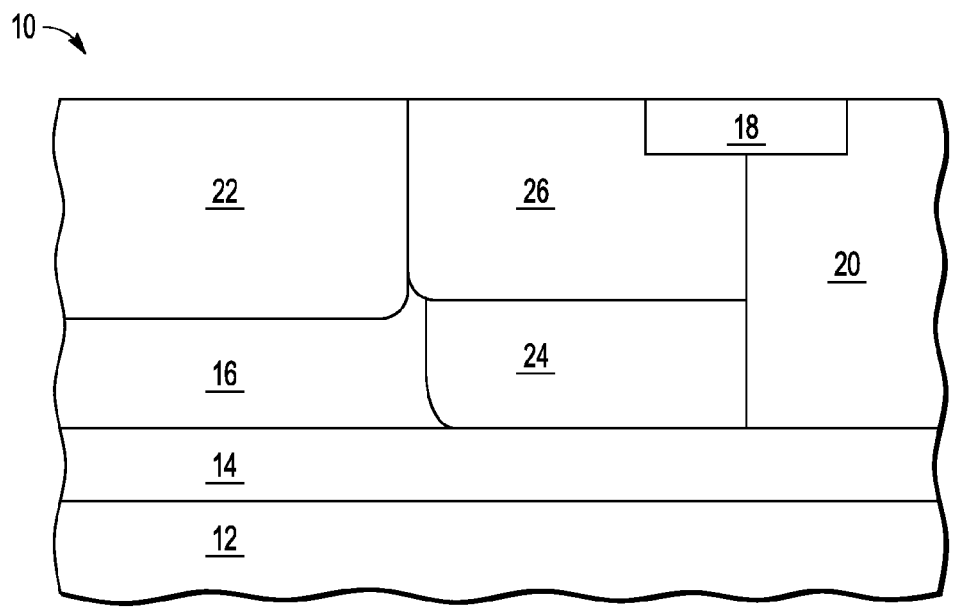

Next, as shown in FIG. 3, two additional regions (24 and 26) may be formed. Using a single mask, for example, a p-type region 24 may be formed first. Next, n-type dopants may be implanted forming a portion of a drift region, also referred to herein as a high-voltage n-type region 26 may be formed. By way of example, because the n-type ions have a higher concentration, they can counter-dope an upper portion of the original p-type region 24. In this manner, the upper portion of p-type region 24 may be converted into a high-voltage n-type region 26.

Figure 4:
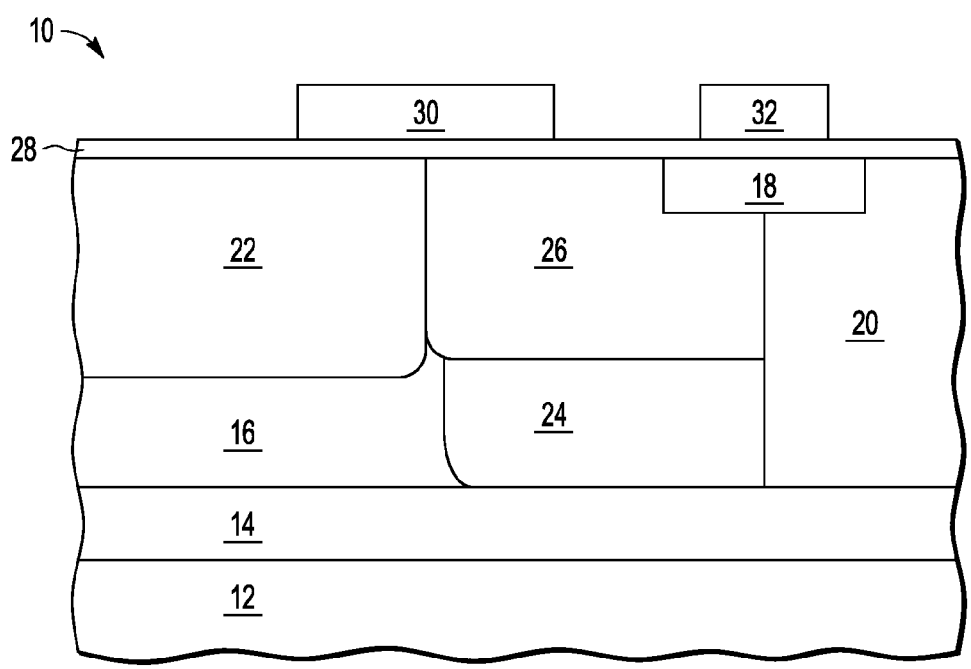

Next, as shown in FIG. 4, gate oxide 28 may be grown or deposited over p-type body region 22, high-voltage n-type region 26, isolation region 18, and n-well region 20. If grown, gate oxide 18 would not be formed over isolation region 18. Next, a gate structure having two gate portions 30 and 32 may be formed over gate oxide 28.

Figure 5:
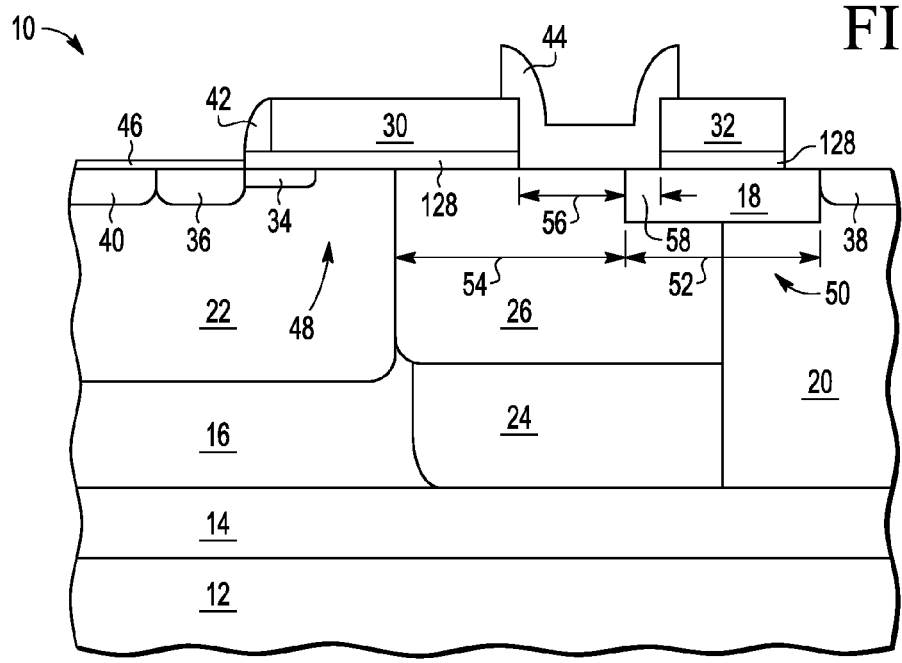

Next, as shown in FIG. 5, a source region and a drain region may be formed. By way of example source region may include a lightly doped n-type extension region 34 and an n+ type source region 36. There may be a spacer 42 between n-type extension region 34 and n+ type source region 36. Drain region 38 may also be an n+ region. In addition, a contact 40 to p-type body region 22 may also be formed. In one embodiment, contact 40 may be a p+ type region. The gap between gate portion 30 and gate portion 32 may be filled using SiN to form, at the same time, spacer 42 and a silicide blocker region 44. In another embodiment, the gap between gate portion 30 and gate portion 32 may be filled using an inter-layer dielectric (ILD) layer. A silicide layer 46 may be formed to connect n+ type source region 36 and contact 40. Silicide layer 46 may also be formed on top of drain region 38. A channel region 48 may be the region between the source region (including lightly doped extension region 34 and n+ type source region 36) and drain region 38. In one embodiment, a drift region 50 (n-type) may include a first portion 52 located under isolation region 18 and a second portion 54 located laterally adjacent to isolation region 18. By way of example to further describe the location of the second portion 54 of drift region 50, a plane at a cross-section of n-type LDMOS transistor 10, wherein the plane is parallel to a major surface of substrate 12, may be envisioned. In this plane, the second portion 54 of drift region 50 may be located between isolation region 18 and the well region, such as p-type body region 22. The two gate portions 30 and 32 of gate structure may be separated by a separation space, wherein the separation space may be located over a portion 56 of the second portion of drift region 50 and a portion 58 of isolation region 18. In one embodiment, the two gate portions 30 and 32 of gate structure may be separated by an opening (which may be filled later), which may include an opening in a portion of isolation region 18 and a portion of drift region 50. In one embodiment, the two gate portions 30 and 32 are coupled to the same biasing source, so they receive the same voltage at all times. Although FIG. 5 shows a specific number of layers arranged in a certain manner, more or fewer layers arranged differently may also be used.

Figure 6:
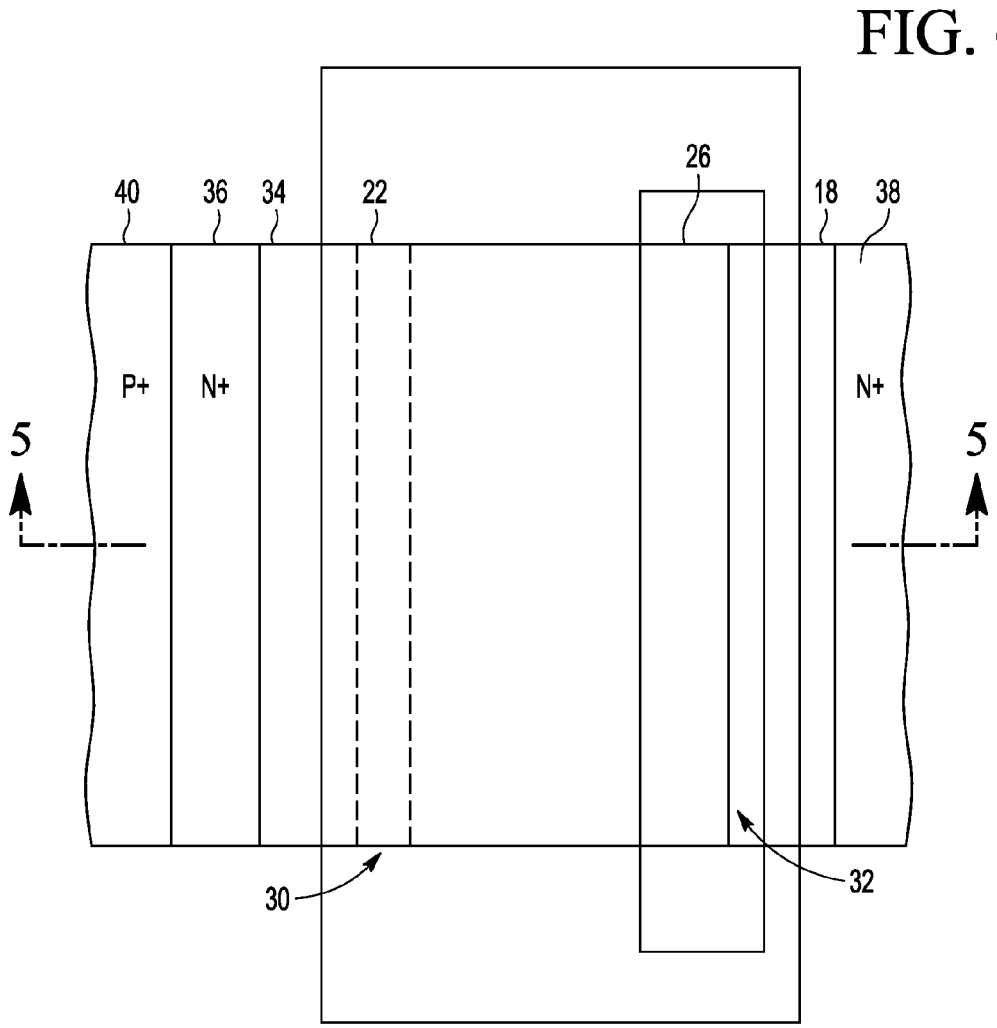
FIG. 6 is a top view of the n-type LDMOS transistor during a processing stage.

Referring now to FIG. 6, a top view of n-type LDMOS transistor 10 of FIG. 5 is shown. This top view is shown to further illustrate two gate portions 30 and 32 of gate structure 31. In one embodiment, gate portion 32 of gate structure 31 may be referred to as a flipper gate. As shown in the top view of n-type LDMOS transistor 10, two gate portions 30 and 32 may form a contiguous structure of a conductive gate material, such as polysilicon. In one embodiment, a portion of isolation region 18 is located over a location of p-type substrate 12, where a portion of drift region 38 abuts and is laterally adjacent to the isolation region 18.

Figure 7:
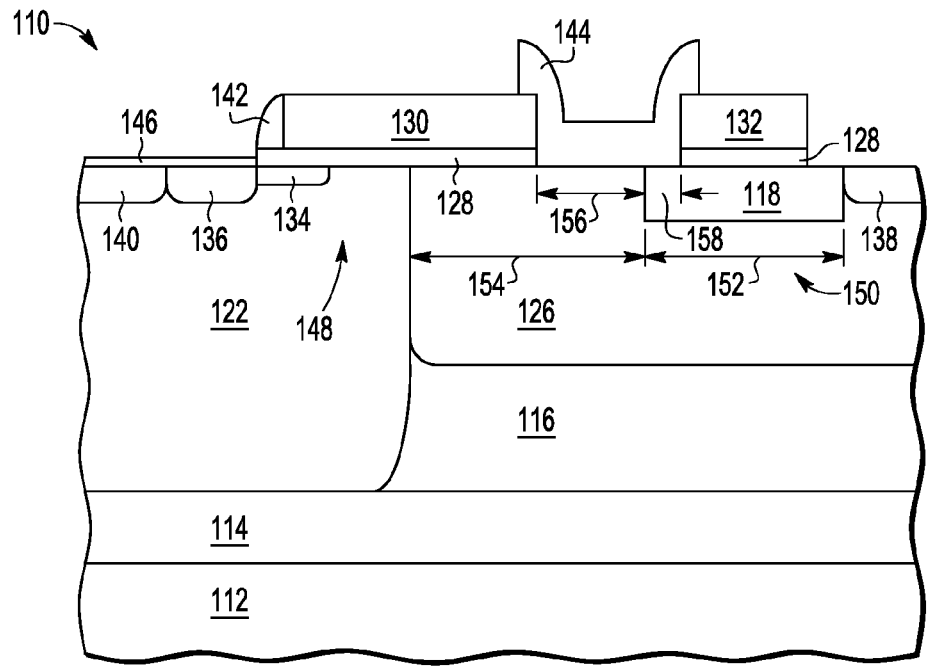
FIG. 7 is a cross-section view of a p-type LDMOS transistor during a processing stage.

FIG. 7 is a cross-section view of a p-type LDMOS transistor 110 during a processing stage. P-type LDMOS transistor 110 may be formed by forming an n-type barrier layer 114 over a p-type substrate 112. In one embodiment, n-type barrier layer may not be formed. Next, as part of forming p-type LDMOS transistor 110, a p-type epitaxial layer 116 may be grown over n-type barrier layer 114. Next, an isolation region 118 may be formed in p-type epitaxial layer 116. Isolation region 118 may be formed by growing field oxide or by forming a shallow trench isolation region. Next, an n-well region 122 may also be formed by implanting dopants in a selective area of p-type epitaxial layer 116. Next, a high-voltage p-type region 126 may be formed. Gate oxide 128 may be grown or deposited over n-well region 122, high-voltage p-type region 126, and isolation region 118. Next, a gate structure having two gate portions 130 and 132 may be formed over gate oxide 128. In one embodiment, the two gate portions 130 and 132 are coupled to the same biasing source, so they receive the same voltage at all times. Next, a source region and a drain region may be formed. By way of example source region may include a lightly doped p-type extension region 134 and a p+ type source region 136. There may be a spacer 142 between n-type extension region 134 and n+ type source region 136. Drain region 138 may also be a p+ region. A channel region 148 may be the region between the source region (including lightly doped extension region 134 and n+ type source region 136) and drain region 138. In addition, a contact 140 to n-well region 122 may also be formed. In one embodiment, contact 140 may be an n+ type region. The gap between gate portion 30 and gate portion 32 may be filled using SiN to form, at the same time, spacer 142 and a silicide blocker region 144. In another embodiment, the gap between gate portion 130 and gate portion 132 may be filled using an inter-layer dielectric (ILD) layer. A silicide layer 146 may be formed to connect p+ type source region 136 and contact 140. Silicide layer 146 may also be formed on top of drain region 38. In one embodiment, a drift region 150 (p-type) may include a first portion 152 located under isolation region 118 and a second portion 154 located laterally adjacent to isolation region 118. By way of example to further describe the location of the second portion 154 of drift region 150, a plane at a cross-section of p-type LDMOS transistor 110, wherein the plane is parallel to a major surface of substrate 112, may be envisioned. In this plane, the second portion 154 of drift region 150 may be located between isolation region 118 and the well region, such n-well region 122. The two gate portions 130 and 132 of gate structure may be separated by a separation space, wherein the separation space may be located over a portion 156 of the second portion of drift region 150 and a portion 158 of isolation region 118.

Figure 8:
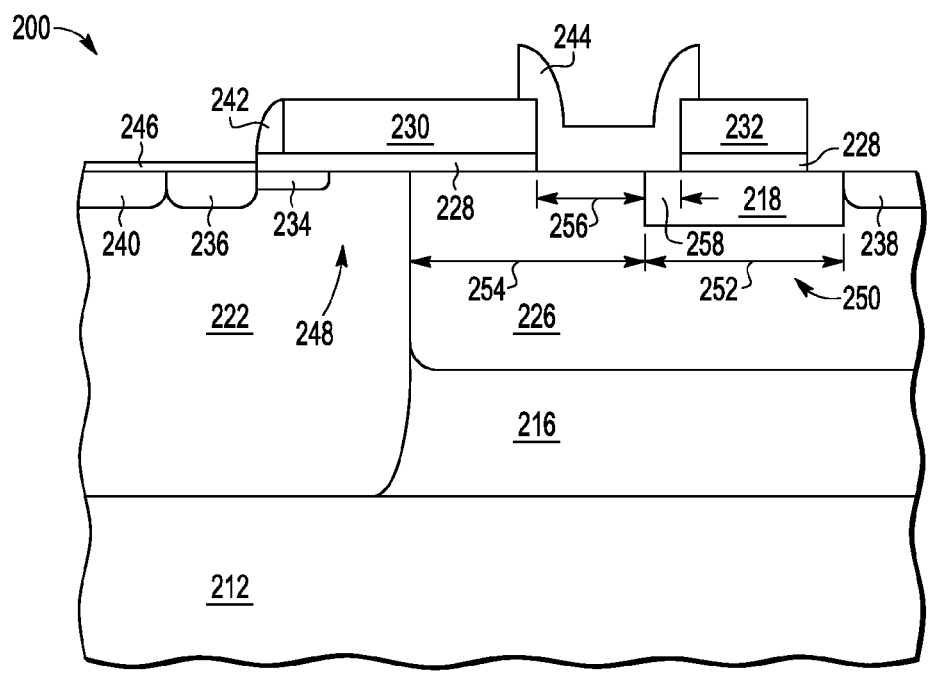
FIG. 8 is a cross-section view of another n-type LDMOS transistor during a processing stage.

FIG. 8 is a cross-section view of another n-type LDMOS transistor 200 during a processing stage. N-type LDMOS transistor 200 may be formed by forming a p-type epitaxial layer 216 over substrate 212. Next, an isolation region 218 may be formed in p-type epitaxial layer 216. Isolation region 218 may be formed by growing field oxide or by forming a shallow trench isolation region that includes a trench filled by TEOS oxide. Next, a p-type body region 222 (also referred to a high voltage p-well region) may also be formed by implanting dopants in a selective area of p-type epitaxial layer 216. Next, a high-voltage n-type region 226 may be formed. By way of example, because the n-type ions have a higher concentration, they can counter-dope an upper portion of the original p-type epitaxial layer 216. In this manner, the upper portion of p-type epitaxial layer 216 may be converted into a high-voltage n-type region 226. Next, gate oxide 228 may be grown or deposited over p-type body region 222, high-voltage n-type region 226, and isolation region 218. Next, a gate structure having two gate portions 230 and 232 may be formed over gate oxide 228.

With continued reference to FIG. 8, a source region and a drain region may be formed. By way of example source region may include a lightly doped n-type extension region 234 and an n+ type source region 236. There may be a spacer 242 between n-type extension region 234 and n+ type source region 236. Drain region 238 may also be an n+ region. In addition, a contact 240 to p-type body region 222 may also be formed. In one embodiment, contact 240 may be a p+ type region. The gap between gate portion 230 and gate portion 232 may be filled using SiN to form, at the same time, spacer 242 and a silicide blocker region 244. In another embodiment, the gap between gate portion 230 and gate portion 232 may be filled using an inter-layer dielectric (ILD) layer. A silicide layer 246 may be formed to connect n+ type source region 236 and contact 240. Silicide layer 246 may also be formed on top of drain region 238. A channel region 248 may be the region between the source region (including lightly doped extension region 234 and n+ type source region 236) and drain region 238. In one embodiment, a drift region 250 (n-type) may include a first portion 252 located under isolation region 218 and a second portion 254 located laterally adjacent to isolation region 218. By way of example to further describe the location of the second portion 254 of drift region 250, a plane at a cross-section of n-type LDMOS transistor 200, wherein the plane is parallel to a major surface of substrate 212, may be envisioned. In this plane, the second portion 254 of drift region 250 may be located between isolation region 218 and the well region, such as p-type body region 222. The two gate portions 230 and 232 of gate structure may be separated by a separation space, wherein the separation space may be located over a portion 256 of the second portion 254 of drift region 250 and a portion 258 of isolation region 218. In one embodiment, the two gate portions 230 and 232 of gate structure may be separated by an opening (which may be filled later), which may include an opening in a portion of isolation region 218 and a portion of drift region 250. In one embodiment, the two gate portions 230 and 232 are coupled to the same biasing source, so they receive the same voltage at all times. In one embodiment, a portion of isolation region 218 is located over a location of p-type substrate 212, where a portion of drift region 238 abuts and is laterally adjacent to the isolation region 218. Although FIG. 8 shows a specific number of layers arranged in a certain manner, more or fewer layers arranged differently may also be used.

By now it should be appreciated that there has been provided various embodiments of LDMOS transistors with a gate structure having a separation space formed in a specific location with respect to the isolation region of the LDMOS transistors.

Because the apparatus implementing the present invention is, for the most part, composed of materials known to those skilled in the art, the material used for forming the various layers and regions have not been explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A transistor comprising:
   a source region of a first conductivity type, the source region located in a substrate structure;
   a drain region of the first conductivity type, the drain region located in the substrate structure;
   a well region of a second conductivity type, the second conductivity type being an opposite conductivity type of the first conductivity type, the well region including a channel region of the transistor;
   an isolation region of a dielectric material located in the substrate structure;
   a drift region of the first conductivity type, the drift region including a first portion located under the isolation region and a second portion located laterally adjacent to the isolation region;
   wherein at a plane at a first cross-section of the transistor, the plane generally parallel to a first major surface of the substrate structure, a second portion of the drift region is located between the isolation region and the well region;
   a first gate structure located over the channel region; and
   a second gate structure located over the isolation region, wherein at the first cross section of the transistor, a first gate structure is separated from the second gate structure by a first separation space, wherein at the first cross section, the first separation space is located over a portion of the second portion of the drift region and a portion of the isolation region;

wherein the first gate structure and the second gate structure are part of a contiguous structure of conductive gate material.

2. The transistor of claim 1, wherein at the first major surface at the first cross section, the second portion of the drift region is located between the isolation region and the channel region, the isolation region is located between the drain region and the second portion of the drift region, and the channel region is located between the second portion of the drift region and the source region.

3. The transistor of claim 1, wherein the isolation region is characterized as a shallow trench isolation region.

4. The transistor of claim 1 further comprising:
a buried layer of the first conductivity type located beneath the drain region, channel region, the drift region, the isolation region, and the source region.

5. The transistor of claim 1, wherein the well region includes a portion located under the source region.

6. The transistor of claim 1 further comprising:
a first doped region of opposite conductivity to the source region, the first doped region serves as a contact region for the well region.

7. The transistor of claim 1 further comprising a gate dielectric layer, the first gate structure and the second gate structure are located on the gate dielectric layer, where a portion of the gate dielectric layer is located on the isolation region.

8. The transistor of claim 1, wherein the first conductivity type is N type and the second conductivity type is P type.

9. A laterally diffused MOS (LDMOS) transistor comprising:
a source region located in a substrate structure;
a drain region located in the substrate structure;
a channel region located in the substrate structure;
an isolation region located in the substrate structure;
a drift region located in the substrate structure, the drift region including a first portion under the isolation region and a second portion laterally adjacent to the isolation region;
a first gate structure located over the channel region; and
a second gate structure located over the isolation region, wherein at a first cross-section, the first gate structure and the second gate structure are physically separated by a first separation space, wherein at the first cross-section, a portion of the first separation space is located over a location of the substrate structure where the second portion of the drift region abuts and is laterally adjacent to the isolation region;
wherein the first gate structure and the second gate structure are part of a contiguous structure of conductive gate material.

10. The LDMOS transistor of claim 9, wherein the isolation region is characterized as a shallow trench isolation region.

11. The LDMOS transistor of claim 9 further comprising:
a buried layer located beneath the drain region, channel region, the drift region, the isolation region, and the source region, wherein the buried layer is of the same conductivity type as the source region and the drain region.

12. The LDMOS transistor of claim 9, wherein the channel region is part of a well region, the well region includes a portion located under the source region.

13. The LDMOS transistor of claim 9, wherein the first gate structure is located over a portion of the second portion of the drift region.

14. The LDMOS transistor of claim 9, wherein the source region includes a lightly doped extension region, wherein the first gate structure is located over a portion of the lightly doped extension region.

15. The LDMOS transistor of claim 9 further comprising dielectric material located in the first separation space.

16. The LDMOS transistor of claim 9, wherein:
the substrate structure has a first major surface, the first gate structure and the second gate structure are located above the first major surface; and
at the first major surface at the first cross section, the second portion of the drift region is located between the isolation region and the channel region, the isolation region is located between the drain region and the second portion of the drift region, and the channel region is located between the second portion of the drift region and the source region.

* * * * *